(12) United States Patent
Glockler et al.

(10) Patent No.: US 11,964,878 B2
(45) Date of Patent: Apr. 23, 2024

(54) ALPHA ALUMINA WITH HIGH PURITY AND HIGH RELATIVE DENSITY, A METHOD FOR ITS PRODUCTION AND ITS USE

(71) Applicant: Sasol Germany GmbH, Hamburg (DE)

(72) Inventors: Reiner Glockler, St. Michaelisdonn (DE); Holger Mitzel, Brunsbuttel (DE)

(*) Notice: Subject to any disclaimer, the term of this patent is extended or adjusted under 35 U.S.C. 154(b) by 434 days.

(21) Appl. No.: 17/260,142

(22) PCT Filed: Jul. 24, 2019

(86) PCT No.: PCT/EP2019/069950
§ 371 (c)(1),
(2) Date: Jan. 13, 2021

(87) PCT Pub. No.: WO2020/020960
PCT Pub. Date: Jan. 30, 2020

(65) Prior Publication Data
US 2021/0317000 A1    Oct. 14, 2021

(30) Foreign Application Priority Data
Jul. 27, 2018    (EP) ..................................... 18186178

(51) Int. Cl.
*C01F 7/441*    (2022.01)

(52) U.S. Cl.
CPC .......... *C01F 7/441* (2013.01); *C01P 2002/60* (2013.01); *C01P 2006/10* (2013.01); *C01P 2006/12* (2013.01)

(58) Field of Classification Search
CPC ....................................................... C01F 7/441
See application file for complete search history.

(56) References Cited

U.S. PATENT DOCUMENTS

| | | |
|---|---|---|
| 2003/0185746 A1 | 10/2003 | Kajihara et al. |
| 2005/0019249 A1 | 1/2005 | Noweck et al. |
| 2010/0167055 A1 | 7/2010 | Ozaki et al. |
| 2011/0123805 A1 | 5/2011 | Ozaki et al. |
| 2011/0223423 A1 | 9/2011 | Ozaki et al. |

FOREIGN PATENT DOCUMENTS

| | | |
|---|---|---|
| JP | 2016-037421 | 3/2016 |
| WO | 9219536 | 11/1992 |

*Primary Examiner* — James A Fiorito
(74) *Attorney, Agent, or Firm* — Werner IP Law, P.C.

(57) ABSTRACT

The present invention relates to an alpha alumina having a high purity, a high density and a low surface area and particularly, to a method to produce such an alpha alumina as well as to the use of the alpha alumina in sapphire production or the production of composite and ceramic bodies.

10 Claims, No Drawings

ALPHA ALUMINA WITH HIGH PURITY AND HIGH RELATIVE DENSITY, A METHOD FOR ITS PRODUCTION AND ITS USE

FIELD OF INVENTION

The present invention relates to a method to produce an alpha alumina and particularly to a method to produce an alpha alumina with a high purity, a high density and a low BET surface area. The invention further extends to an alumina produced according to the method of the invention as well as to the use of the alpha alumina in sapphire production or the production of composite and ceramic bodies.

BACKGROUND OF THE INVENTION

In the technology area of ultra-high purity alumina the focus is to produce an alumina with high purity, high density and a low BET surface area. In EP 2070873 B1 an alpha alumina powder having a purity of at least 99.99% and a relative density of between 55 to 90% is described. This powder is prepared by calcining amorphous alumina hydroxide (obtained by the hydrolysis of an aluminium alkoxide with stoichiometric amounts of water at room temperature in a two-step process) in the presence of alpha alumina seeds.

There is a need to produce an alumina having a high purity and a higher density without using alpha alumina seeds, i.e. to simplify the process.

SUMMARY OF THE INVENTION

According to a first aspect of the invention there is provided a method to produce an alpha alumina, in particular a high purity alpha alumina, comprising at least the steps of:
  i) providing a boehmite slurry comprising boehmite; wherein the crystallite sizes of the boehmite of the boehmite slurry is independently in the range of between 3.0 and 6.5 nm along the 120 axis and 3.0 and 6.0 nm along the 020 axis.
  ii) aging the boehmite slurry to obtain an aged boehmite slurry comprising boehmite particles with a modified crystallite size having a (120) axis and a (020) axis, wherein the aging is carried out at a temperature of between 30 and 240° C. for a period of between 0.5 and 170 hours until the boehmite particles:
    a) either have a difference between the length along the (120) axis and the length along the (020) axis of smaller than 1 nm, or
    b) the (120) axis is larger than 30 nm, or
    c) both a) and b) apply;
  iii) drying the aged boehmite slurry to form a dried boehmite, and
  iv) calcining the dried boehmite at a temperature of between 1200 to 1600° C. for a time of calcination of between 1 and 5 hours to produce the alpha alumina.

Difference means length along the (120) axis minus length along the (020) axis. The difference may therefore also have negative value.

The difference between the length along the (120) axis and the length along the (020) axis is preferably bigger than 0 nm and smaller than 1 nm, more preferably bigger than 0.05 nm and smaller than 1 nm, even more preferably bigger than 0.1 nm and smaller than 1 nm and most preferably bigger than 0.5 nm and smaller than 1 nm.

Also preferred is the combination of a) and b), namely wherein a) includes the preferred ranges as above and at the same time wherein the (120) axis is larger than 30 nm.

Further claimed is an alpha alumina produced according to the above method and the use of the alpha alumina for sapphire production or for the production of a ceramic body or a composite body, in particular by applying pressure and/or sintering.

DETAILED DESCRIPTION OF THE INVENTION

As per the present invention by ensuring that the aged boehmite slurry produces boehmite particles that either have a difference in crystallite size along the (120) axis and the (020) axis of less than 1 nm, preferably bigger than 0 nm and smaller than 1 nm, more preferably bigger than 0.05 nm and smaller than 1 nm, even more preferably bigger than 0.1 nm and smaller than 1 nm and most preferably bigger than 0.5 nm and smaller than 1 nm or a crystallite size along the (120) axis of larger than 30 nm, preferably larger than 40 nm, one is able to obtain a pure alumina having a relative density of above 90% without using alumina seeds. To be clear, as per the invention either option a) of step ii) or option b) of step ii) is required to be followed. Alternatively, both option a) and option b) may be followed.

For option a) the length along the (120) axis of the boehmite particles (which means after applying the aging of step ii)) is preferably at least 7 nm and more preferably at least 10 nm and most preferably at least 13 nm.

The boehmite slurry may be obtained by known methods in the art of the invention such as by the hydrolysis of aluminium alkoxide for example as described in U.S. Pat. No. 3,394,990. Examples of commercial boehmite products produced from the hydrolysis of aluminium alkoxide include PURAL® and CATAPAL®.

Depending on the purity of the aluminium alkoxide used for the hydrolysis the purity of the boehmite is in the range of between 99.8000 and 99.9999%, preferably between 99.9900 and 99.9997%. This is the purity required in the field of ultra high purity alumina.

The boehmite slurry is preferably aged at a temperature of between 95 and 160° C. for a period of between 25 and 40 hours. The aging may take place under agitation. Agitation may be provided with a paddle stirrer at a circumferential velocity of 0.5 to 4 m/s, preferably 1 to 3 m/s, in particular for option a).

The crystallite size of the boehmite particles according to the invention are determined on the (120) and (020) reflexes using the generally known Scherrer formula (1):

$$\text{Crystallite size} = (K \times \text{lambda} \times 57.3)/(\text{beta} \times \cos \theta); \quad (1)$$

where
  K (form factor): 0.992
  Lambda (x-ray wave length): 0.154 nm
  beta (corrected line broadening of apparatus): reflex dependent
  theta: reflex dependent A person skilled in the art knows that in the X-ray diffraction pattern of Boehmite the (120) reflex (reflex along the 120 axis) is located at 2 theta=28.2° and the (020) reflex (reflex along the 020 axis) is located at 2 theta=14.5°. Using these values, the corresponding crystallite size for each reflex can be calculated according to equation (1) from the corrected line broadening calculated by equation (2).

$$\text{beta} = \text{half width of the sample} - \text{half width of standard} \quad (2)$$

With respect to option b) the crystallite size of the aged boehmite particles along the (120) axis is preferably between larger than 30 and 100 nm, more preferably between larger than 30 and 50 nm or between larger than 40 and 60 nm.

The drying step may be carried out in a spray dryer. Typical temperatures include an inlet temperature of between 300 and 500° C., preferably between 320 to 400° C. and an outlet temperature of between 100 and 150° C., preferably between 110 and 120° C.

Calcination of the dried boehmite preferably occurs at a temperature of between 1300 to 1400° C. and more preferably at a temperature of between 1350 and 1360° C. The time of calcination is preferably between 3 to 4 hours. The heating ramp up rate of the calciner is preferably between 2 and 8° C./min and more preferably between 4 and 8° C./min. The temperature, time of calcination and ramp up rate can be selected independently of one another.

The method of the invention produces an alpha alumina having a relative density higher than 90%, preferably a relative density higher than 94%, and a BET surface area less than 10 $m^2/g$ %.

According to a second aspect of the invention there is therefore provided an alpha alumina produced according to the method of the invention.

The alpha alumina produced according to the method of the invention may have a purity of above 99.99% and a relative density of above 90%, preferably a relative density of above 94%, and a BET surface area of less than 10 $m^2/g$.

According to a third aspect of the invention, there is provided an alpha alumina having a purity of at least 99.99% and a relative density above 90%, preferably a relative density above 94%, and a BET surface area of less than 10 $m^2/g$.

In a further preferred embodiment of the present invention, the alpha alumina of the invention is used as a raw material in powder form for the production of sapphires. For example, sapphire can be produced by charging alpha alumina powder in a crucible, heating and melting the alpha alumina powder. The alpha alumina powder can be charged in the crucible at a high bulk density and is suitable for producing sapphire having less voids.

According to a further preferred embodiment of the present invention, the alpha alumina of the invention is used as a raw material possibly together with further raw materials in the production of ceramic or composite bodies which are typically produced in a mould by applying heat and/or pressure.

The invention will now be described with reference to the following non-limiting examples.

EXAMPLES

Crystallite size was measured as per the Scherrer equation described above.

The purity of the high purity alpha alumina was measured by ICP atomic emission i.e. the contents of Ca, Fe, Na, Si and Ti were measured by an ICP atomic emission spectrometer after dissolution using Spectrosolv® PSS with microwave heating.

The purity is calculated according to equation (3):

$$\text{Purity in \%} = 100[1-(\text{total amount of impurities in ppm})/10^6] \quad (3)$$

% means wt. % with respect to the metals comprised in the composition.

Further, the content of sulphate, chloride and phosphate is in total less than 200 ppm.

The Relative Density is calculated from the Particle Density using equations (4) (6):

$$\text{Closed Pore Volume (cm}^3/\text{g)} = (1/\text{Particle Density}) - (1/3.98) \quad (4)$$

$$\text{Sintered Density (g/cm}^3) = 1/[(1/3.98) + \text{Pore Volume} + \text{Closed Pore Volume}] \quad (5)$$

$$\text{Relative Density (\%)} = (\text{Sintered Density}/3.98) \times 100 \quad (6)$$

The Particle Density (equation 4) is determined using the ULTRA PYCNOMETER 1000 T (Quantachrome).

The XRD-measurements are carried out using a Philips XRD X'pert apparatus.

The Pore Volume (equation 5) is determined by the mercury penetration method in accordance to DIN 66133 within a pore radius range of 1.8 to 1000 nm.

BET surface area refers to the BrunauerEmmettTeller method for the determination of specific surface area by N2 adsorption. using typical volumetric devices like the Quadrasorb from Quantachrome at temperature of liquid nitrogen. The surface area is determined using DIN ISO 9277: 2003-05.

Comparative Example 1 (Related to Option a) of Step ii) of the Method of the Invention)

500 g of a suspension of PURAL® in water (10.5 wt. % $Al_2O_3$, pH=9) were added into an autoclave which was heated to 110° C. (1° C./min.). After the reaction conditions had been adjusted the slurry was allowed to age for 24 hours at 110° C. using a standard agitator running at a peripheral velocity of 1.6 m/s corresponding to an agitator speed of 500 r.p.m. After cooling down to room temperature the aged slurry was spray dried (inlet temperature: 350° C., outlet temperature: 110° C.). The crystallite sizes were 14.1 nm along the 120 axis and 10.6 nm along the (020) axis. The particles were then calcined at 1350° C. for 4 hours (heating rate 1° C./min.) Pure alpha alumina having a purity of 99.9990% was obtained and the relative density was 59.6%. The BET surface area was 16 $m^2/g$.

Comparative Example 2 (Related to Option b) of Step ii)

500 g of a suspension of PURAL® in water (7.5 wt. % $Al_2O_3$) were added into an autoclave which was heated to 140° C. (1° C./min.). The autogenous pressure was 5 bar. After the reaction conditions had been adjusted the slurry was allowed to age at 140° C. for 30 hours using a standard agitator running at a peripheral velocity of 3.0 m/s corresponding to an agitator speed of 265 r.p.m. After cooling down to room temperature the aged slurry was spray dried (inlet temperature: 350° C., outlet temperature: 110° C.). The crystallite size was 24.7 nm along the 120 axis. The particles were then calcined at 1350° C. for 4 hours (heating rate 1° C./min.) Pure alpha alumina having a purity of 99.9992% was obtained and the relative density was 85.2%. The BET surface area was 11 $m^2/g$.

Example 1 (Related to Option a) of Step ii) of the Method of the Invention)

500 g of a suspension of PURAL® in water (10.5 wt. % Al₂O₃, pH=9) were added into a beaker which was heated to 98° C. (1° C./min.). After the reaction conditions had been adjusted the slurry was allowed to age for 30 hours at 98° C. using a standard agitator running at a peripheral velocity of 1.6 m/s corresponding to an agitator speed of 500 r.p.m. After cooling down to room temperature the aged slurry was spray dried (inlet temperature: 350° C., outlet temperature: 110° C.). The crystallite sizes were 13.8 nm along the 120 axis and 13.1 nm along the 020 axis. The particles were then calcined at 1350° C. for 4 hours (heating rate 1° C./min.) Pure alpha alumina having a purity of 99.9996% was obtained and the relative density was 97.9%. The BET surface area was 4 m²/g.

Example 2 (Related to Option b) of Step ii) of the Method of the Invention)

500 g of a suspension of PURAL® in water (7.5 wt. % Al₂O₃) were added into an autoclave which was heated to 160° C. (1° C./min.). The autogenous pressure was 10 bar. After the reaction conditions had been adjusted the slurry was allowed to age for 30 hours at 160° C. using a standard agitator running at a peripheral velocity of 3 m/s corresponding to an agitator speed of 265 r.p.m. After cooling down to room temperature the aged slurry was spray dried (inlet temperature: 350° C., outlet temperature: 110° C.). The crystallite size was 35.8 nm along the 120 axis. The particles were then calcined at 1350° C. for 4 hours (heating rate 1° C./min.) Pure alpha alumina having a purity of 99.9994% was obtained and the relative density was 94.1%. The BET surface area was 8 m²/g.

Example 3 (Related to Option b) of Step ii) of the Method of the Invention)

500 g of a suspension of PURAL® in water (7.5 wt. % Al₂O₃) were added into an autoclave which was heated to 180° C. (1° C./min.). The autogenous pressure was 15 bar. After the reaction conditions had been adjusted the slurry was allowed to age for 30 hours at 180° C. using a standard agitator running at a peripheral velocity of 1.6 m/s corresponding to an agitator speed of 500 r.p.m. After cooling down to room temperature the aged slurry was spray dried (inlet temperature: 350° C., outlet temperature: 110° C.). The crystallite size was 41.8 nm along the 120 axis. The particles were then calcined at 1350° C. for 4 hours (heating rate 1° C./min.) Pure alpha alumina having a purity of 99.9996% was obtained and the relative density was 97.4%. The BET surface area was 7 m²/g.

The results of the Experiments are outlined in the Tables hereunder:

TABLE 1

Option a) of step ii) of the method of the invention:

| | Crystallite size [120] | Crystallite size [020] | Difference = ([120] – [020]) | Relative Density | Total impurity content | Surface Area BET |
|---|---|---|---|---|---|---|
| Comparative Example 1 | 14.1 nm | 10.6 nm | 3.5 nm | 59.6% | 10 ppm | 16 m²/g |
| Example 1 | 13.8 nm | 13.1 nm | 0.7 nm | 97.9% | 4 ppm | 4 m²/g |

TABLE 2

Option b) of step ii) of the method of the invention:

| | Crystallite Size [120] | Relative Density | Total impurity content | Surface Area BET |
|---|---|---|---|---|
| Example 2 | 35.8 nm | 94.1% | 6 ppm | 8 m²/g |
| Example 3 | 41.8 nm | 97.4% | 4 ppm | 7 m²/g |
| Comparative Example 2 | 24.7 nm | 85.2% | 8 ppm | 11 m²/g |

As can be seen by the Examples when compared to the Comparative Examples, the method of the present invention produces an alpha alumina having a purity of above 99.99% and a relative density of above 90%, preferably a relative density of above 94%, and a BET surface area lower than 10 m²/g.

The invention claimed is:

1. A method to produce an alpha alumina comprising at least the steps of:
    i) providing a boehmite slurry comprising boehmite; wherein a crystallite size of the boehmite is in the range of between 3.0 and 6.5 nm along a (120) axis thereof and 3.0 and 6.0 nm along a (020) axis thereof;
    ii) aging the boehmite slurry to obtain an aged boehmite slurry comprising boehmite particles with a modified crystallite size, wherein the aging is carried out at a temperature of between 30 and 240° C. for a period of between 0.5 and 170 hours until the boehmite particles of the aged boehmite slurry:
        a) either have a difference between the crystallite size along the (120) axis and the crystallite size along the (020) axis bigger than 0 and smaller than 1 nm, or
        b) have the crystallite size along the (120) axis being larger than 30 nm, or
        c) have both conditions of a) and b) applying thereto;
    iii) drying the aged boehmite slurry to form a dried boehmite, and
    iv) calcining the dried boehmite at a temperature of between 1300 to 1400° C. for a time of calcination of between 1 and 5 hours to produce the alpha alumina.

2. The method of claim 1 wherein the boehmite slurry is obtained by hydrolysis of aluminium alkoxide.

3. The method of claim 1 wherein the difference between the crystallite size along the (120) axis and the crystallite size along the (020) axis of the boehmite particles of the aged boehmite slurry is bigger than 0.05 nm and smaller than 1 nm.

4. The method of claim 1, wherein condition a) of step ii) applies thereto and with respect to condition a) of step ii) the crystallite size along the (120) axis is at least 7 nm.

5. The method of claim 1, wherein condition b) of step ii) applies thereto and with respect to condition b) of step ii) the crystallite size along the (120) axis is larger than 40 nm.

6. The method of claim 1, wherein the purity of the boehmite is in the range of between 99.8000 and 99.9999%.

7. The method of claim 1, wherein the boehmite slurry is aged at a temperature of between 95 and 160° C. for a period of between 25 and 40 hours.

8. The method of claim 1, wherein condition b) of step ii) applies thereto and with respect to condition b) of step ii) the crystallite size along the (120) axis is between 30 and 100 nm.

9. The method of claim 1, wherein the drying step is carried out in a spray dryer having an inlet temperature of between 300 and 500° C. and an outlet temperature of between 100 and 150° C.

10. The method of claim 1, wherein calcination occurs at a temperature of between 1350 to 1400° C.

* * * * *